United States Patent
Tsukihara

(10) Patent No.: US 8,592,713 B2
(45) Date of Patent: Nov. 26, 2013

(54) IRRADIATING APPARATUS, SEMICONDUCTOR DEVICE MANUFACTURING APPARATUS, SEMICONDUCTOR DEVICE MANUFACTURING METHOD, AND DISPLAY DEVICE MANUFACTURING METHOD

(75) Inventor: Koichi Tsukihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/115,922

(22) Filed: May 6, 2008

(65) Prior Publication Data
US 2008/0280458 A1 Nov. 13, 2008

(30) Foreign Application Priority Data
May 11, 2007 (JP) ................................. 2007-127098

(51) Int. Cl.
*H01L 21/268* (2006.01)
*G02B 26/10* (2006.01)
*B23K 26/073* (2006.01)

(52) U.S. Cl.
USPC ............... 219/121.61; 219/121.65; 359/618; 250/492.22; 250/492.23; 372/101; 372/108

(58) Field of Classification Search
USPC ............. 219/121.61, 121.65, 121.66, 121.76, 219/121.77; 438/795; 372/50.12, 101, 108; 257/E21.475; 250/492.22, 492.23; 359/618
See application file for complete search history.

(56) References Cited

U.S. PATENT DOCUMENTS

| | | | | |
|---|---|---|---|---|
| 5,961,861 | A * | 10/1999 | McCay et al. | 219/121.83 |
| 6,717,106 | B2 * | 4/2004 | Nagano et al. | 219/121.83 |
| 7,079,566 | B2 * | 7/2006 | Kido et al. | 372/101 |
| 7,277,229 | B2 * | 10/2007 | Kato | 359/618 |
| 7,968,432 | B2 * | 6/2011 | Tamura et al. | 438/463 |
| 2002/0164069 | A1 * | 11/2002 | Nagano et al. | 382/154 |
| 2005/0048383 | A1 * | 3/2005 | Taniguchi et al. | 430/5 |
| 2006/0126690 | A1 * | 6/2006 | Kido et al. | 372/43.01 |
| 2006/0186415 | A1 * | 8/2006 | Asano | 257/72 |
| 2008/0026550 | A1 * | 1/2008 | Werner et al. | 438/535 |

FOREIGN PATENT DOCUMENTS

| | | | |
|---|---|---|---|
| JP | 356144534 A | * | 11/1981 |
| JP | 11-002769 | | 1/1999 |
| JP | 2000-305036 | | 11/2000 |
| JP | 02003158088 A | * | 5/2003 |
| JP | 2006-295068 | | 10/2006 |
| JP | 2007-027612 | | 3/2007 |

OTHER PUBLICATIONS

Japanese Office Action issued on Aug. 14, 2012, in connection with counterpart JP Application No. 2007-127098.

* cited by examiner

*Primary Examiner* — Samuel M Heinrich
(74) *Attorney, Agent, or Firm* — Dentons US LLP

(57) ABSTRACT

An irradiating apparatus for irradiating an irradiation object with beam light emitted from a semiconductor laser, wherein letting w be a radius of a beam for irradiating the irradiation object, $\Delta$ be a rate of individual difference in angle of divergence of the semiconductor laser, and $\lambda$ be beam wavelength of the semiconductor laser, a focal position of an irradiating optical system interposed between the semiconductor laser and the irradiation object is defocused such that a distance z between the focal position and the irradiation object is $$z = \frac{\pi \cdot w^2}{\lambda} \cdot \frac{1-\Delta^2}{(1-\Delta^2)^2+1}. \quad \text{[Equation 1]}$$

9 Claims, 12 Drawing Sheets

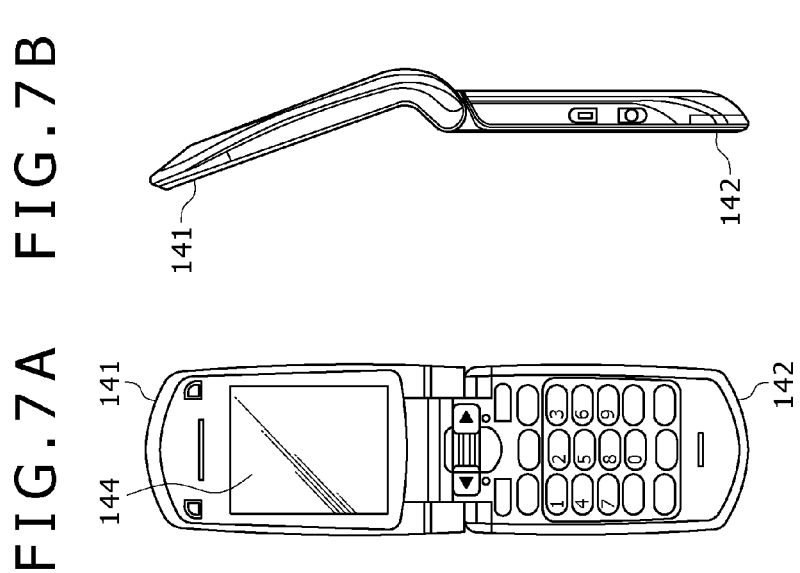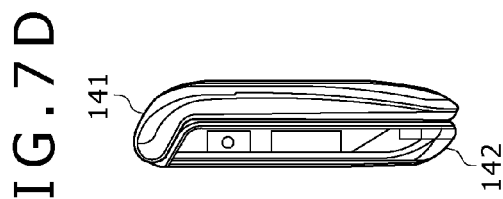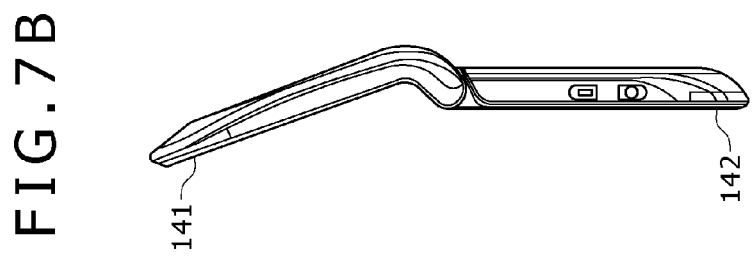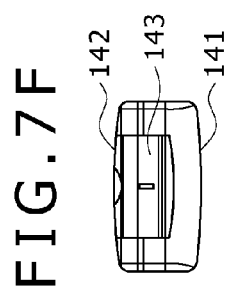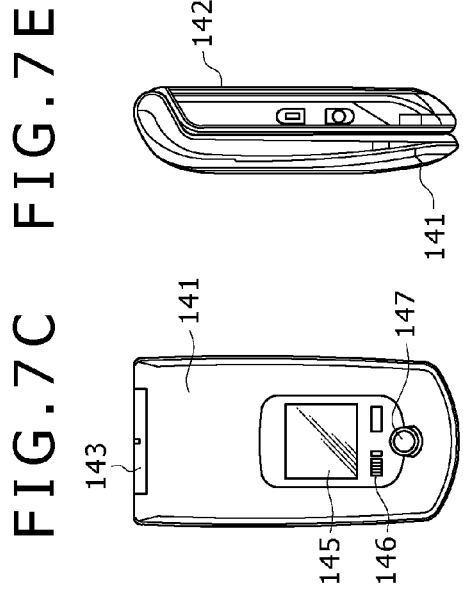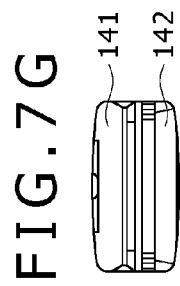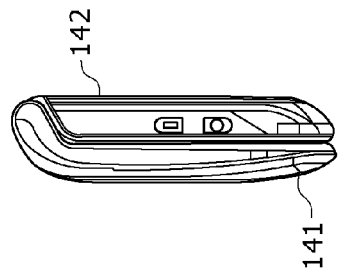

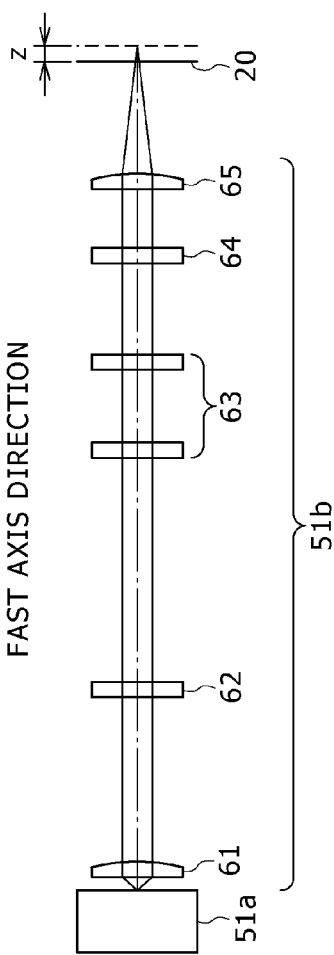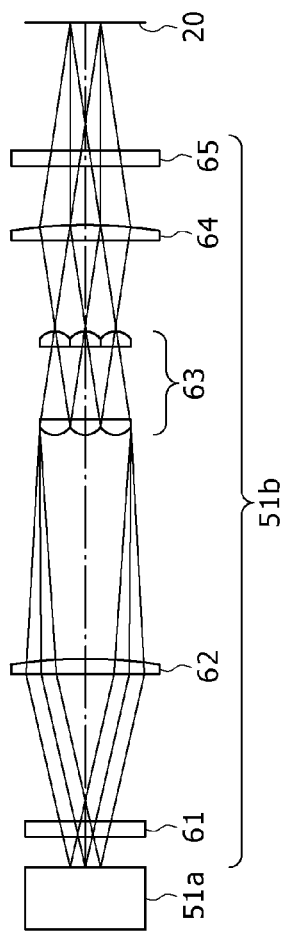

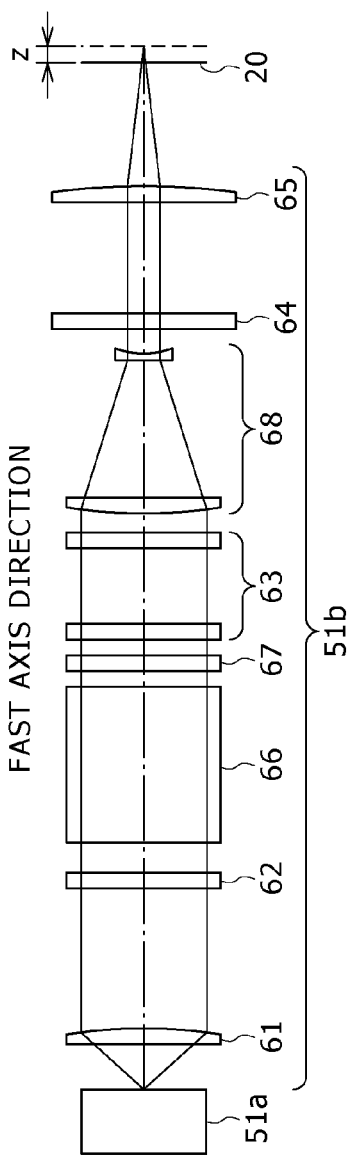
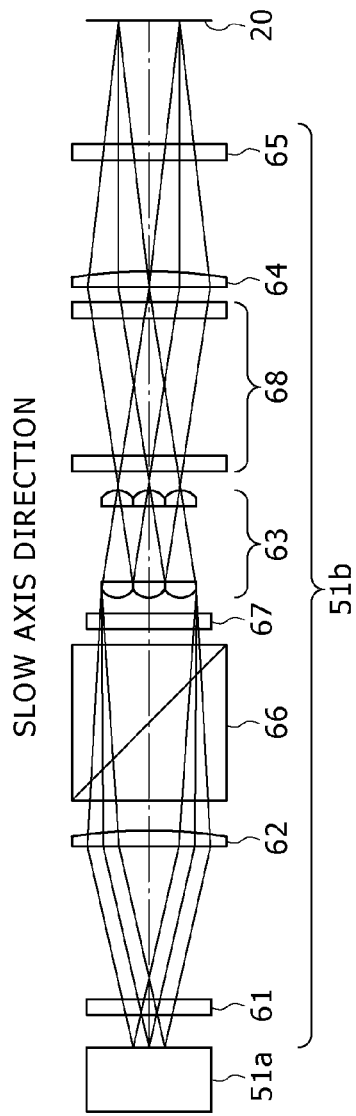

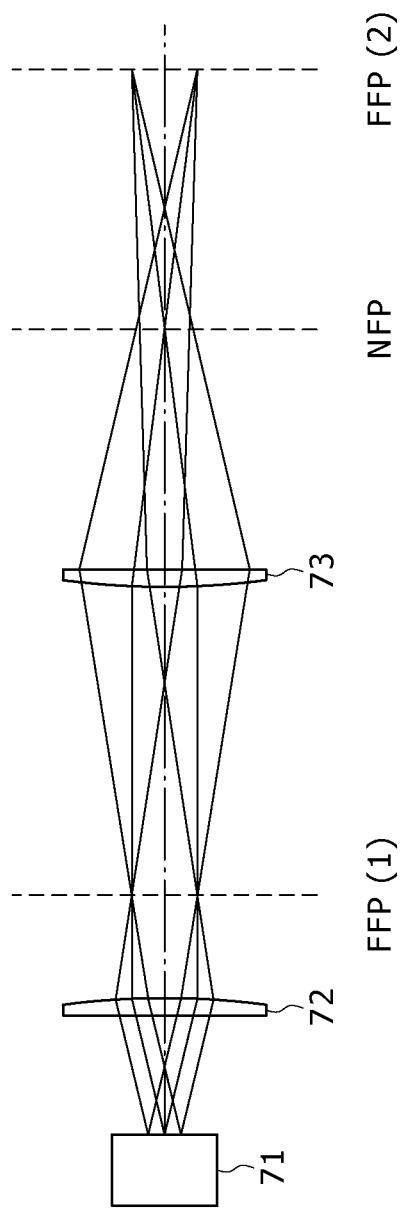

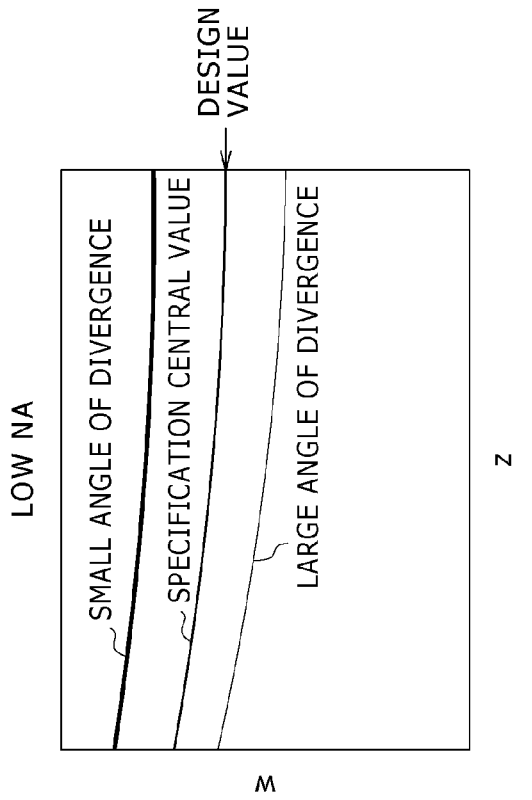
FIG.13A
FIG.13B
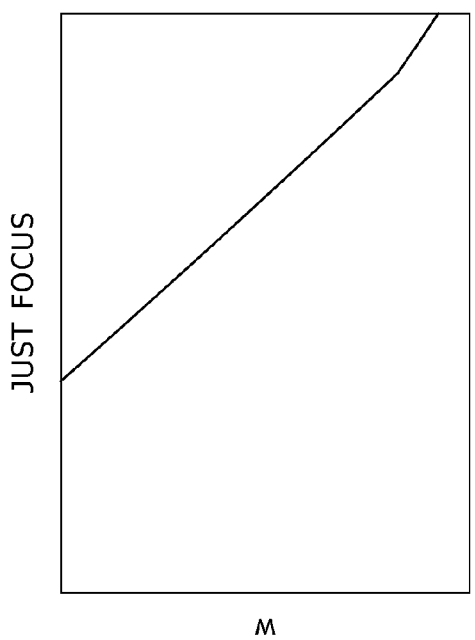

IRRADIATING APPARATUS, SEMICONDUCTOR DEVICE MANUFACTURING APPARATUS, SEMICONDUCTOR DEVICE MANUFACTURING METHOD, AND DISPLAY DEVICE MANUFACTURING METHOD

CROSS REFERENCES TO RELATED APPLICATIONS

The present invention contains subject matter related to Japanese Patent Application JP 2007-127098, filed in the Japan Patent Office on May 11, 2007, the entire contents of which being incorporated herein by reference.

BACKGROUND OF THE INVENTION

1. Field of the Invention

The present invention relates to an irradiating apparatus for performing irradiation with beam light using a semiconductor laser as a light source, a semiconductor device manufacturing apparatus for manufacturing a semiconductor device using irradiation with the beam light, a semiconductor device manufacturing method, and a display device manufacturing method.

2. Description of the Related Art

It is known that when an active matrix type liquid crystal display device, an organic electroluminescent display device (hereinafter referred to as an "organic EL display") using an organic electroluminescent element (hereinafter referred to as an "organic EL element"), or the like is manufactured, a thin silicon film is subjected to annealing treatment using continuously oscillating laser beam light to form a circuit element such as a thin film transistor (hereinafter abbreviated to a "TFT") or the like by polycrystalline silicon. The annealing treatment using the laser beam light partly irradiates the thin silicon film, so that increases in temperature of the whole of a substrate can be avoided and a glass substrate can be used as the substrate.

It is also known that output beam light from an irradiating optical system of an annealing apparatus is desirably a linear beam in order to achieve higher throughput when the annealing treatment using the laser beam light is performed. It is further known that in order to form uniform polycrystalline silicon by such annealing treatment, a so-called uniformizing optical system is desirably formed in a direction of a major axis of the linear beam to thereby suppress nonuniformity of irradiation of the thin silicon film in the direction of the major axis.

FIG. 12 shows an example of configuration of an irradiating optical system in a direction of length of an emitter (hereinafter referred to as a "slow axis direction"), which is an example of an existing technique using a broad area type semiconductor laser. In the irradiating optical system shown in FIG. 12, a luminous flux from a semiconductor laser 71 is collimated by a collimator lens 72, and a resulting far field pattern FFP(1) is projected into a far field pattern FFP(2) by an image forming lens 73. A luminous flux in a direction (hereinafter referred to as a "fast axis direction") perpendicular to the slow axis direction is condensed in a near field pattern NFP. When reaching the far field pattern FFP(2), the beam is made to have a same beam diameter in each of the directions (the slow axis direction and the fast axis direction). Thereby, even when an object to be irradiated which object is placed in the far field pattern FFP(2) is shifted in a direction of an optical axis, change in beam diameter is small and depth of focus is large (see Japanese Patent Laid-open No. 2000-305036, for example).

SUMMARY OF THE INVENTION

However, the following problems may occur when irradiation is performed with laser light using the irradiating optical system based on the existing technique described above.

In the irradiating optical system based on the existing technique, defocus occurs in the fast axis direction, and therefore, as shown in FIG. 13A, the depth of focus is not necessarily said to be large for an application sensitive to the beam diameter in the fast axis direction. Reducing an irradiation numerical aperture (NA) is considered in order to increase the depth of focus. However, when the irradiation NA is reduced too much, as shown in FIG. 13B, the beam diameter may deviate from a design value due to effect of individual difference in angle of divergence of the semiconductor laser 71. The irradiating optical system cannot correct the effect. The angle of divergence of the semiconductor laser 71 is varied greatly due to individual difference as compared with other specifications (for example, wavelength, an oscillation threshold value, positional accuracy, oscillation power and the like), and produces great effects on characteristics of the optical system such as the beam diameter, shading and the like.

In addition, because the angle of divergence of the semiconductor laser 71 is varied greatly due to individual difference, after the semiconductor laser 71 is replaced or when parallel irradiation is performed by a plurality of semiconductor lasers 71, for example, the beam diameter in the far field pattern FFP(2) is changed due to the difference in angle of divergence. As a result, conditions for laser light irradiation may be different after the replacement of the semiconductor laser 71 or between the different semiconductor lasers 71, for example. In order to deal with such a difference, the adjustment of a focal position may be enabled by using a Z-stage 75 for moving a semiconductor laser 71 and an irradiating optical system 74 along the direction of an optical axis, as shown in FIG. 14, for example. In this case, an adjusting mechanism such as the Z-stage 75 or the like, a beam diameter measuring device 76 necessary for the adjustment, and the like are required, which invites for example a decrease in processing efficiency attendant on the complication of a device constitution and the complication of a processing procedure.

It is accordingly desirable to provide an irradiating apparatus that can irradiate an irradiation object with laser light without being affected by individual difference of a semiconductor laser or the like, by optimizing a focal position for a necessary beam diameter, a semiconductor device manufacturing apparatus, a semiconductor device manufacturing method, and a display device manufacturing method.

According to an embodiment of the present invention, there is provided an irradiating apparatus for irradiating an irradiation object with beam light emitted from a semiconductor laser, wherein letting w be a radius of a beam for irradiating the irradiation object, $\Delta$ be a rate of individual difference in angle of divergence of the semiconductor laser, and $\lambda$ be beam wavelength of the semiconductor laser, a focal position of an irradiating optical system interposed between the semiconductor laser and the irradiation object is defocused such that a distance z between the focal position and the irradiation object is $$z = \frac{\pi \cdot w^2}{\lambda} \cdot \frac{1-\Delta^2}{(1-\Delta^2)^2+1} \quad \text{[Equation 5]}$$

With the irradiating apparatus having the above-described constitution, the focal position of the irradiating optical system is not on the irradiation object but is defocused from the surface of the irradiation object by the distance z, and the amount of defocus is optimized for the necessary irradiation beam radius w. Thus, an irradiating optical system that can provide the desired irradiation beam radius w without being affected by individual difference in angle of divergence of the semiconductor laser and which achieves a greatest depth of focus is realized.

According to the present invention, a desired beam diameter can be obtained without being affected by individual difference in angle of divergence of the semiconductor laser. It is therefore possible to avoid causing a difference in conditions for irradiation with laser beam light after the replacement of the semiconductor laser, eliminate a need for the setting of conditions such as focus adjustment and the like, and expect for example an improvement in processing efficiency attendant on the simplification of a device constitution and the simplification of a processing procedure as a result of obviating a need for a Z-stage and the like. In addition, also when an apparatus including a semiconductor laser and an irradiating optical system is mass-produced, for example, there is no effect of individual difference in angle of divergence of the semiconductor laser. Therefore the yield of the product is improved greatly, which also leads to a reduction in cost of the product.

BRIEF DESCRIPTION OF THE DRAWINGS

FIGS. 7A to 7G are diagrams showing a portable terminal device, for example a portable telephone as a concrete example of an electronic device;

FIGS. 9A and 9B are diagrams of assistance in explaining an example of configuration of an irradiating optical system to which the present invention is applied;

FIGS. 11A and 11B are diagrams of assistance in explaining another example of configuration of an irradiating optical system to which the present invention is applied;

FIG. 12 is a diagram of assistance in explaining an example of configuration of an existing irradiating optical system;

FIGS. 13A and 13B are diagrams of assistance in explaining outlines of a problem related to depth of focus in existing techniques and effects of individual differences in angle of divergence between semiconductor lasers in the existing techniques.

DETAILED DESCRIPTION OF THE PREFERRED EMBODIMENTS

An irradiating apparatus, a semiconductor device manufacturing apparatus, a semiconductor device manufacturing method, and a display device manufacturing method according to embodiments of the present invention will hereinafter be described with reference to the drawings.

An outline of a semiconductor device manufactured using irradiation with laser light will first be described.

The semiconductor device to be described in the following is obtained through modification of an amorphous silicon film (amorphous silicon will hereinafter be described as "a-Si") from an amorphous state to a polycrystalline state, that is, modification of the amorphous silicon film from a-Si into a polycrystalline silicon film (polysilicon will hereinafter be described as "p-Si"). Specifically, a TFT, which is a thin film semiconductor device, is cited as an example of the semiconductor device.

The TFT is for example used to form a display device such as an active matrix type liquid crystal display device, an organic EL display or the like.

Figure 1:
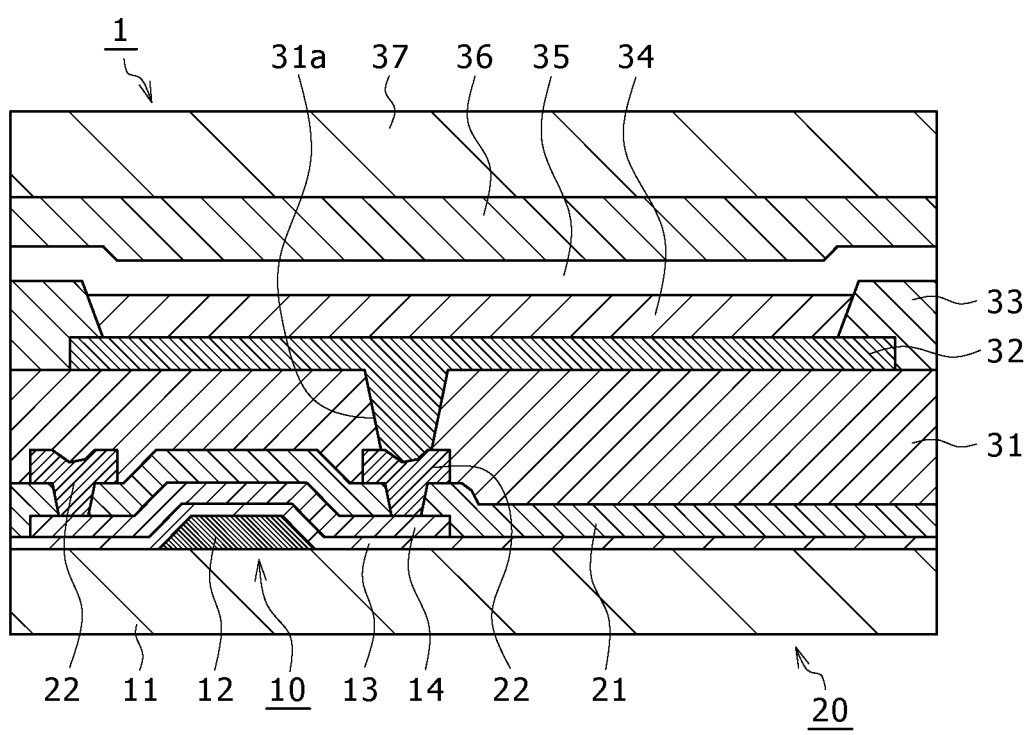
FIG. 1 is a diagram of assistance in explaining an example of constitution of an organic EL display including a TFT.

FIG. 1 is a diagram of assistance in explaining an example of constitution of an organic EL display including a TFT.

The organic EL display 1 having the constitution of FIG. 1 is manufactured by the following procedure.

First, a gate film 12 is formed by a Mo film, for example, by pattern formation on a glass substrate 11, and the gate film 12 is thereafter covered by a gate insulating film 13 formed by a SiO/SiN film, for example. Then, a semiconductor layer 14 made of an a-Si film is formed on the gate insulating film 13. The semiconductor layer 14 is subjected to laser annealing treatment to be modified from the a-Si film to a p-Si film by crystallization. Next, the semiconductor layer 14 is patterned into an insular shape covering the gate film 12. Thereafter, an insulative pattern (not shown) is formed at a position where the semiconductor layer 14 coincides with the gate film 12 by backside exposure from the semiconductor substrate 11 side, and a source and a drain are formed in the semiconductor layer 14 by ion implantation and activation annealing treatment with the insulative pattern as a mask. A TFT 10 of a so-called bottom gate type is thereby formed with the gate film 12, the gate insulating film 13, and the semiconductor layer 14 laminated in order on the semiconductor substrate 11. While the bottom gate type is taken as an example in this case, a TFT of a top gate type may be used.

Thereafter, the TFT 10 is covered with an interlayer insulating film 21, and wiring 22 connected to the TFT 10 via connection holes formed in the interlayer insulating film 21 is provided to form a pixel circuit. Thus, a so-called TFT substrate 20 is formed.

After the formation of the TFT substrate 20, the surface of the TFT substrate 20 is covered by a planarizing insulating film 31, and a connection hole 31a reaching the wiring 22 is formed in the planarizing insulating film 31. Then, a pixel electrode 32 connected to the wiring 22 via the connection hole 31a is formed as an anode, for example, on the planarizing insulating film 31, and an insulating film pattern 33 in such a shape as to cover the periphery of the pixel electrode 32 is formed. An organic EL material layer 34 is laminated and formed in a state of covering an exposed surface of the pixel electrode 32. Further, a counter electrode 35 is formed in a state of being kept insulated from the pixel electrode 32. The counter electrode 35 is formed as a cathode of a transparent conductive material, for example, and is formed in the shape of a solid film common to all pixels. Thus, an organic EL element is formed in which the organic EL material layer 34 such as an organic hole transporting layer, an organic light emitting layer and the like is disposed between the pixel electrode 32 as the anode and the counter electrode 35 as the cathode. Incidentally, while a top emission system is taken as an example in this case, it suffices in the case of a bottom emission system to form the pixel electrode 32 by a conductive transparent film and form the counter electrode 35 by a high-reflection metallic film. In addition, a microcavity structure that resonates light using a half mirror as the counter electrode 35 or the pixel electrode 32 may be adopted.

Thereafter, a transparent substrate 37 is bonded onto the counter electrode 35 via an optically transparent adhesive layer 36, whereby the organic EL display 1 is completed.

Figure 2A:
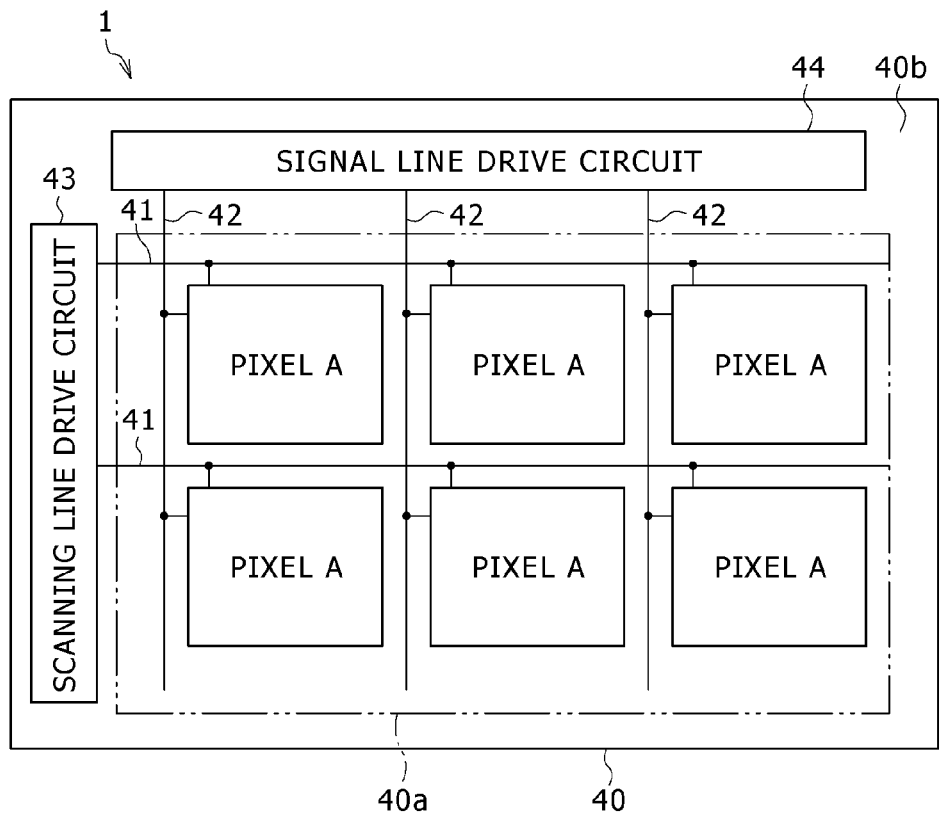
FIGS. 2A and 2B are diagrams of assistance in explaining an example of a pixel circuit configuration of the organic EL display.
Figure 2B:
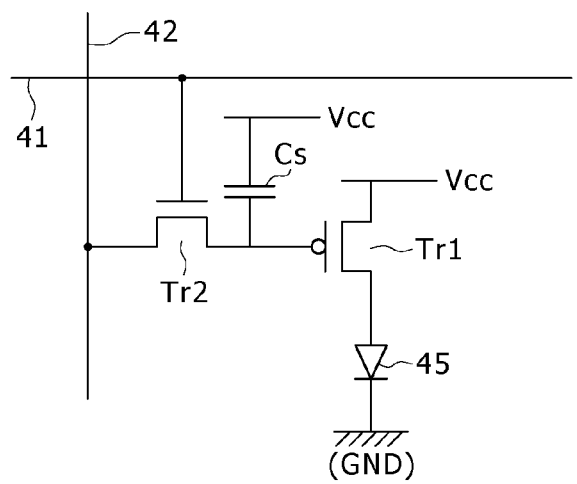

FIGS. 2A and 2B are diagrams of assistance in explaining an example of a pixel circuit configuration of the organic EL display. In the following, an active matrix type organic EL display 1 using an organic EL element as a light emitting element is taken as an example.

As shown in FIG. 2A, a display area 40a and a peripheral area 40b on the periphery of the display area 40a are set on a substrate 40 of the organic EL display 1. The display area 40a is formed as a pixel array unit in which a plurality of scanning lines 41 and a plurality of signal lines 42 are arranged vertically and horizontally and one pixel A is provided in correspondence with each of intersection parts of the scanning lines 41 and the signal lines 42. An organic EL element is provided in each of these pixels a. A scanning line driving circuit 43 for scanning and driving the scanning lines 41 and a signal line driving circuit 44 for supplying a video signal (that is, an input signal) corresponding to luminance information to the signal lines 42 are arranged in the peripheral area 40b.

In the display area 40a, or full color-capable image display, organic EL elements corresponding to respective color components of R, G, and B are mixed with each other, and these organic EL elements are pattern-arranged in the form of a matrix according to a predetermined rule. While the numbers of organic EL elements placed and the areas of organic EL elements formed for the respective color components may be equal to each other, the numbers of organic EL elements placed and the areas of organic EL elements formed for the respective color components may be made different from each other according to energy components of the respective different color components, for example.

As shown in FIG. 2B, a pixel circuit provided in each pixel A includes for example an organic EL element 45, a driving transistor Tr1, a writing transistor (sampling transistor) Tr2, and a storage capacitor Cs. A video signal written from a signal line 42 via the writing transistor Tr2 by driving by the scanning line driving circuit 43 is retained by the storage capacitor Cs, a current corresponding to the quantity of the retained signal is supplied to the organic EL element 45, and the organic EL element 45 emits light at a luminance corresponding to the value of the current.

Incidentally, the configuration of the pixel circuit as described above is a mere example. A capacitive element may be provided within the pixel circuit as required, or a plurality of transistors may be further provided to form the pixel circuit. In addition, a necessary driving circuit is added to the peripheral area 40b according to a change in the pixel circuit.

The display device typified by the organic EL display 1 described above is used as a display device for various electronic devices shown in FIGS. 3 to 7, for example electronic devices in all fields that display a video signal input thereto or a video signal generated therein as an image or video, such as digital cameras, notebook personal computers, portable terminal devices such as portable telephones and the like, video cameras, and the like. Concrete examples of electronic devices using the display device will be described in the following.

Incidentally, the display device includes a display device in the form of a sealed module. For example, a display module formed by bonding a counter part such as a transparent glass or the like to the pixel array unit corresponds to a display device in the form of a sealed module. This transparent counter part may be provided with a color filter, a protective film or the like, and a light shielding film as described above. The display module may be provided with a circuit part for externally inputting or outputting a signal and the like to the pixel array unit, an FPC (Flexible Printed Circuit), or the like.

Figure 3:
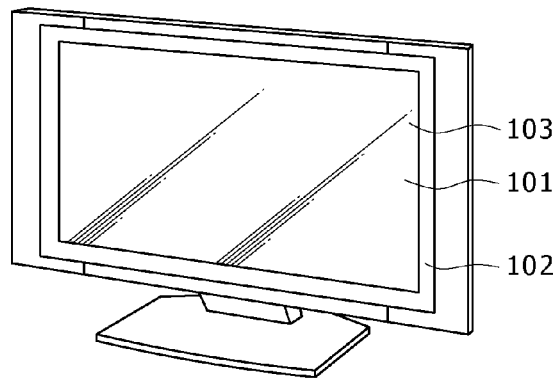
FIG. 3 is a perspective view of a television set as a concrete example of an electronic device.

FIG. 3 is a perspective view of a television set as a concrete example of an electronic device. The television set shown in FIG. 3 includes a video display screen part 101 composed of a front panel 102, a filter glass 103 and the like, and is fabricated using the display device as the video display screen part 101.

Figure 4A:
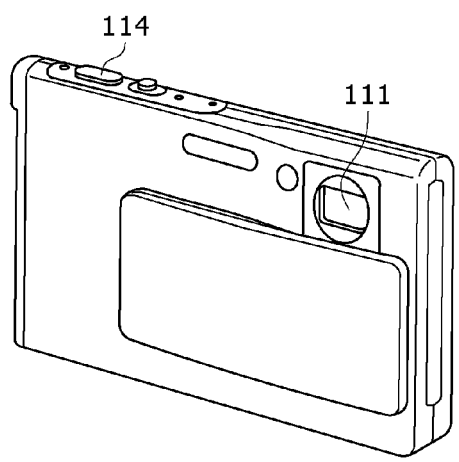
FIGS. 4A and 4B are perspective views of a digital camera as a concrete example of an electronic device.
Figure 4B:
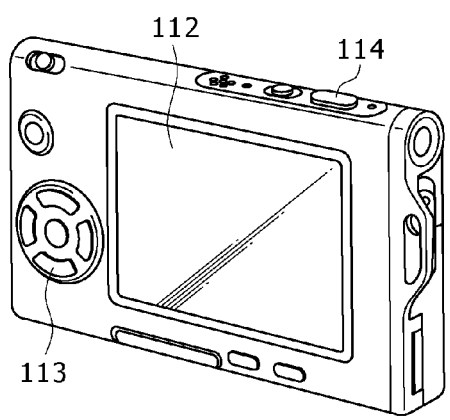

FIGS. 4A and 4B are perspective views of a digital camera as a concrete example of an electronic device. FIG. 4A is a perspective view of the digital camera as viewed from a front side, and FIG. 4B is a perspective view of the digital camera as viewed from a back side. The digital camera shown in FIGS. 4A and 4B includes a light emitting part 111 for flashlight, a display part 112, a menu switch 113, a shutter button 114, and the like. The digital camera is fabricated using the display device as the display part 112.

Figure 5:
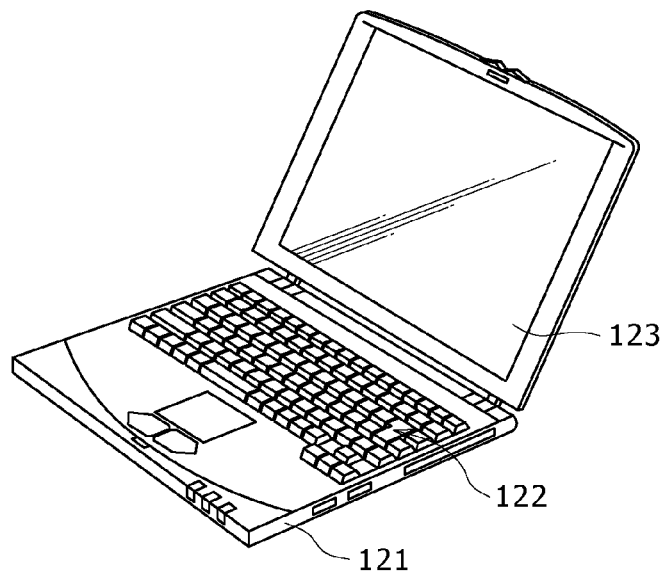
FIG. 5 is a perspective view of a notebook personal computer as a concrete example of an electronic device.

FIG. 5 is a perspective view of a notebook personal computer as a concrete example of an electronic device. The notebook personal computer includes a keyboard 122 operated to input characters and the like, a display part 123 for displaying an image, and the like in a main unit 121. The notebook personal computer is fabricated using the display device as the display part 123.

Figure 6:
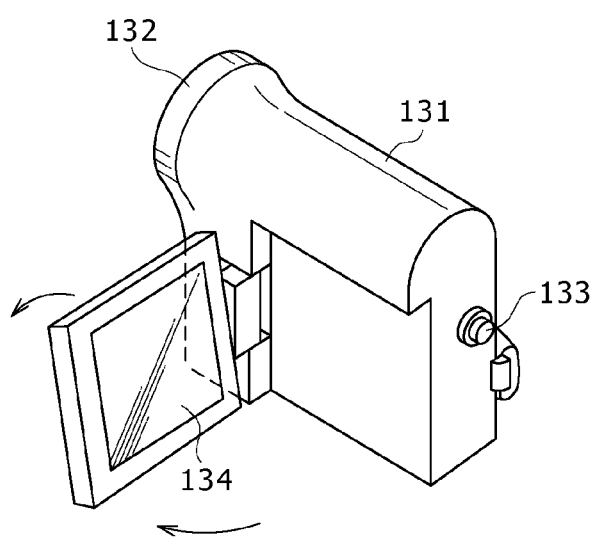
FIG. 6 is a perspective view of a video camera as a concrete example of an electronic device.

FIG. 6 is a perspective view of a video camera as a concrete example of an electronic device. The video camera shown in FIG. 6 includes a main unit 131, a lens 132 for taking a subject in a frontward side surface, a start/stop switch 133 at a time of picture taking, a display part 134, and the like. The video camera is fabricated using the display device as the display part 134.

FIGS. 7A through 7G are diagrams showing a portable terminal device, for example a portable telephone as a concrete example of an electronic device. FIG. 7A is a front view of the portable telephone in an opened state, FIG. 7B is a side view of the portable telephone in the opened state, FIG. 7C is a front view of the portable telephone in a closed state, FIG. 7D is a left side view, FIG. 7E is a right side view, FIG. 7F is a top view, and FIG. 7G is a bottom view. The portable telephone according to the present example of application includes an upper side casing 141, a lower side casing 142, a coupling part (a hinge part in this case) 143, a display 144, a sub-display 145, a picture light 146, a camera 147 and the like. The portable telephone is fabricated using the display device as the display 144 and the sub-display 145.

Features of the present embodiment will next be described.

A major feature of the present embodiment is laser annealing treatment performed on the semiconductor layer 14 of the TFT 10 in a process of manufacturing the TFT 10

Figure 8:
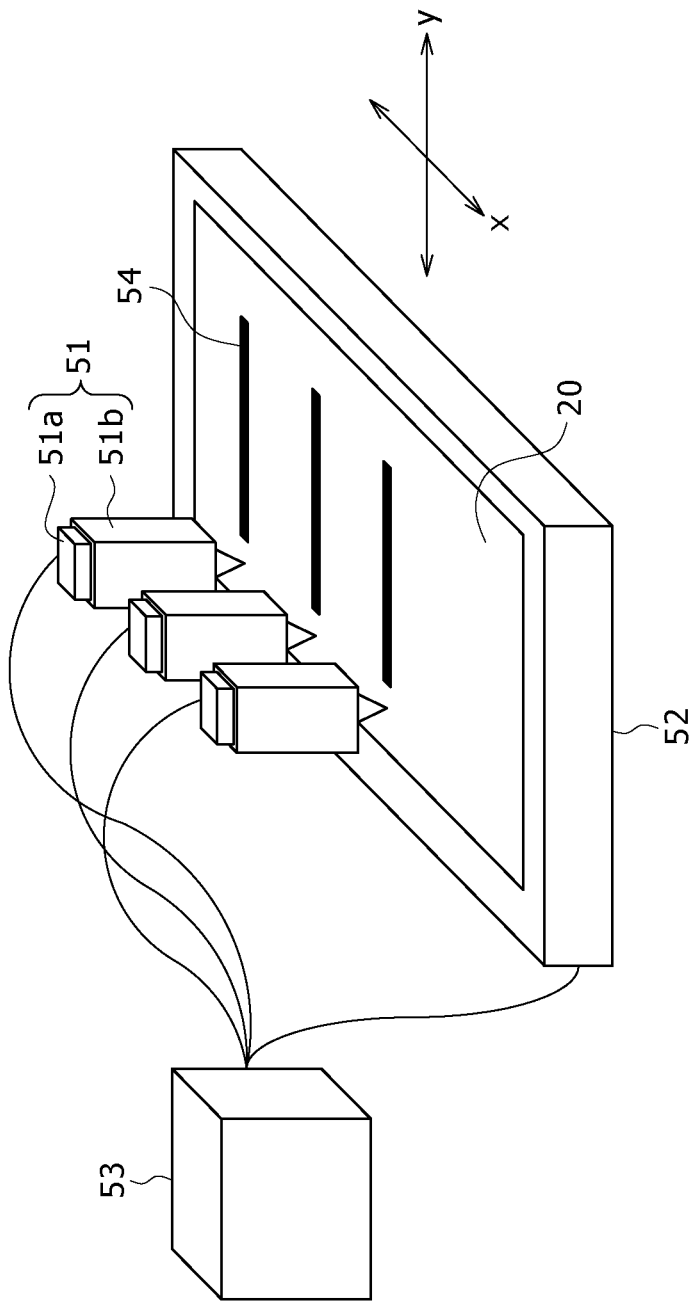
FIG. 8 is a diagram of assistance in explaining an example of constitution of a laser annealing apparatus as one of manufacturing apparatuses used in a process of manufacturing a TFT.

FIG. 8 is a diagram of assistance in explaining an example of constitution of a laser annealing apparatus that performs laser annealing treatment, that is, a laser annealing apparatus as one of manufacturing apparatuses used in the process of manufacturing the TFT 10.

The laser annealing apparatus shown in FIG. 8 has a plurality of (for example three) laser irradiation optical units 51 disposed in parallel with each other, the laser irradiating optical units 51 each including a semiconductor laser 51*a* and an irradiating optical system 51*b*.

The semiconductor laser 51*a* in each of the laser irradiating optical units 51 has a broad area type emitter. The diameter direction of emitted beam light is defined in a direction perpendicular to the direction of length of the emitter. A semiconductor laser emitting beam light having a wavelength of 700 to 1000 nm can be used as such a semiconductor laser 51*a*. However, it is desirable to use a high-power semiconductor laser having a wavelength in the region of 800 nm or a wavelength in the region of 940 nm, for example. By thus forming the light sources of the irradiating apparatus, the light sources are miniaturized, and the emitted laser beam light is easily formed into a linear beam, as will be described later.

The laser annealing apparatus also has a stage 52 movable along an X-axis and a Y-axis in addition to the plurality of laser irradiating optical units 51. The TFT substrate 20 is set on the stage 52. More specifically, the slow axis direction of each of the semiconductor lasers 51*a* is parallel to the X-axis direction of the stage 52.

A controller 53 controls the operation of both the semiconductor laser 51*a* in each of the laser irradiating optical units 51 and the stage 52. Specifically, the respective operations of the semiconductor laser 51*a* in each of the laser irradiating optical units 51 and the stage 52 are controlled such that during scanning of the stage 52 in the Y-axis direction, the semiconductor laser 51*a* oscillates to irradiate the TFT substrate 20 on the stage 52 with laser beam light from the semiconductor laser 51*a* via the irradiating optical system 51*b*. Thereby, the TFT substrate 20 on the stage 52 moves in a direction perpendicular to the broad area direction of the semiconductor laser 51*a*, and an irradiation state of the laser beam light on the TFT substrate 20 is a linear form 54 as shown in FIG. 8.

When laser annealing treatment is performed using the thus formed laser annealing apparatus, the laser annealing treatment can be simultaneously performed on a number of pixels which number corresponds to the number of laser irradiating optical units disposed in parallel with each other, and therefore the throughput of the laser annealing treatment can be improved as compared with a case of performing irradiation on a single axis rather than parallel irradiations on a plurality of axes.

FIGS. 9A and 9B are diagrams of assistance in explaining an example of configuration of the irradiating optical system 51*b* in each of the laser irradiating optical units 51. FIG. 9A shows the fast axis direction of the broad area type semiconductor laser 51*a*. FIG. 9B shows the slow axis direction of the broad area type semiconductor laser 51*a*.

As shown in FIGS. 9A and 9B, the irradiating optical system 51*b* interposed between the broad area type semiconductor laser 51*a* and the TFT substrate 20 as an object irradiated by the semiconductor laser 51*a* includes: collimator lenses 61 and 62 for collimating a luminous flux from the semiconductor laser 51*a*; a cylindrical lens array 63 as a uniformizing optical system for uniformizing the luminous flux in a direction of length of the emitter of the semiconductor laser 51*a*; a condenser lens 64 for irradiating the TFT substrate 20 with the luminous flux obtained through the uniformizing optical system; and a condensing lens 65 as a reducing optical system for reducing the diameter of the luminous flux in the direction perpendicular to the direction of length of the emitter of the semiconductor laser 51*a*. In the fast axis direction, the luminous flux emitted from the semiconductor laser 51*a* is collimated by the collimator lens 61, and then condensed onto the TFT substrate 20 by the condensing lens 65. Meanwhile, in the slow axis direction, the luminous flux emitted from the semiconductor laser 51*a* illuminates the cylindrical lens array 63 through the collimator lens 62, and then the TFT substrate 20 is irradiated uniformly with each luminous flux from the cylindrical lens array 63 through the condenser lens 64. Incidentally, because it suffices to realize each of these constituent elements using a publicly known constituent element, description thereof will be omitted.

The irradiating optical system 51*b* in the present embodiment has a major feature in that the focal position of the irradiating optical system 51*b* or, to be more exact, the focal position of the condensing lens 65 forming the irradiating optical system 51*b* is not on the TFT substrate 20 as an irradiated object but is defocused by a distance z, which will be described later in detail, and an amount of defocus of the focal position is optimized for a necessary irradiation beam diameter.

A feature of the irradiating optical system 51*b* in the present embodiment, that is, the defocus of the focal position will be described below in detail.

Letting $\pm\Delta$ be a rate of individual difference in angle of divergence of the semiconductor laser 51*a* in the laser irradiating optical unit 51, an irradiation NA of the condensing lens 65 in consideration of a variation due to the individual difference is as in the following Equation (1).

$$\left.\begin{array}{l} NA_1 = (1+\Delta)NA_c \\ NA_2 = (1-\Delta)NA_c \end{array}\right\} \quad (1)$$

In Equation (1), $NA_1$ is the irradiation NA of the condensing lens 65 when the rate of individual difference in angle of divergence is $+\Delta$; $NA_2$ is the irradiation NA of the condensing lens 65 when the rate of individual difference in angle of divergence is $-\Delta$; and $NA_c$ is a specification central value of the irradiation NA of the condensing lens 65.

The waist radii of irradiation light when irradiation is performed at the irradiation $NA_1$ and the irradiation $NA_2$ are as in the following Equation (2)

$$\left.\begin{array}{l} w_1 = \dfrac{\lambda}{\pi NA_1} \\ w_2 = \dfrac{\lambda}{\pi NA_2} \end{array}\right\} \quad (2)$$

In Equation (2), $w_1$ is the waist radius of irradiation light at the irradiation $NA_1$; $w_2$ is the waist radius of irradiation light at the irradiation $NA_2$; and $\lambda$ is the beam wavelength of beam light emitted from the semiconductor laser 51*a*.

A beam radius when the beam light emitted from the semiconductor laser 51*a* is defocused is as in the following Equation (3).

$$w(z) = w_1 \left(1 + \left(\frac{\lambda z}{\pi w_1^2}\right)^2\right)^{\frac{1}{2}}$$
$$w(z) = w_2 \left(1 + \left(\frac{\lambda z}{\pi w_2^2}\right)^2\right)^{\frac{1}{2}} \quad (3)$$

In Equation (3), w(z) is the beam radius when the beam light emitted from the semiconductor laser 51a is defocused, and z is an amount of defocus.

When calculated from these equations, the irradiation $NA_c$ for achieving a desired beam diameter in the fast axis direction, that is, the irradiation $NA_c$ to be satisfied by the condensing lens 65 can be determined as in the following Equation (4).

$$NA_c = \frac{\lambda}{\pi \cdot w} \sqrt{1 + \frac{1}{(1-\Delta^2)^2}} \quad (4)$$

Hence, setting the value of the amount of defocus z, that is, the magnitude of the distance z by which the focal position of the condensing lens 65 is defocused from the surface of the TFT substrate 20 as in the following Equation (5) realizes the irradiating optical system 51b that can achieve the desired beam diameter without effects of individual difference in angle of divergence of the semiconductor laser 51a and which achieves a greatest depth of focus.

$$z = \frac{\pi \cdot w^2}{\lambda} \cdot \frac{1-\Delta^2}{(1-\Delta^2)^2 + 1} \quad (5)$$

In Equation (5), z is the distance between the focal position of the irradiating optical system 51b interposed between the semiconductor laser 51a and the TFT substrate 20 as an irradiated object and the TFT substrate 20; w is the desired irradiation beam radius of the laser irradiating optical units 51; $\lambda$ is the beam wavelength of the semiconductor laser 51a; and $\Delta$ is a rate of individual difference in angle of divergence of the semiconductor laser 51a.

Incidentally, in the slow axis direction, as is clear from FIG. 9B, focus is achieved on the TFT substrate 20.

Figure 10:
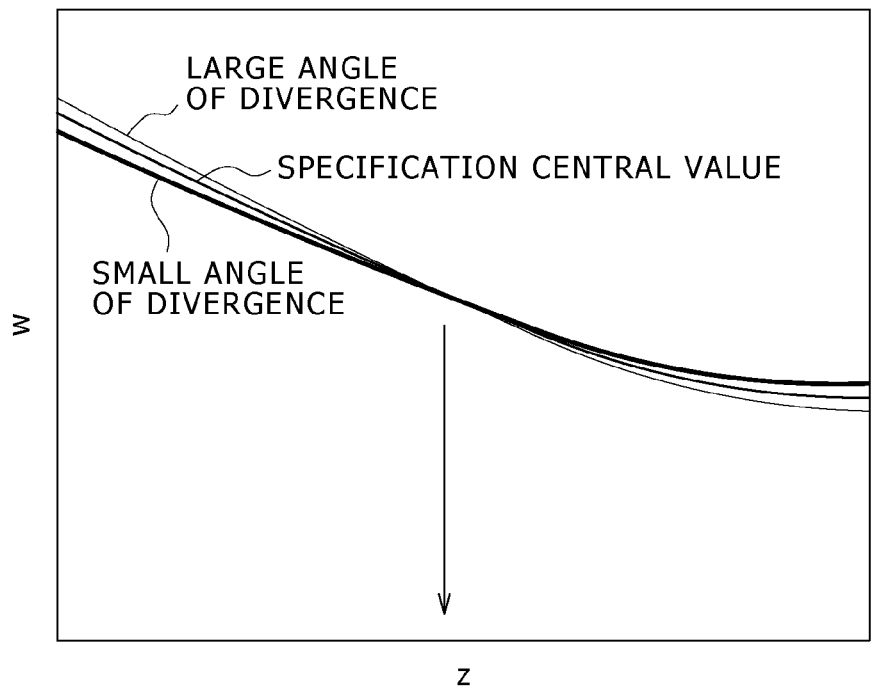
FIG. 10 is a diagram of assistance in explaining a concrete example of relation between a beam diameter and an amount of defocus.

FIG. 10 is a diagram of assistance in explaining a concrete example of relation between the beam diameter and the amount of defocus. FIG. 10 shows relations between the amount of defocus z and the irradiation beam radius w in respective cases where the angle of divergence of the semiconductor laser 51a is a specification central value and is different from the specification central value by the rates of $\pm\Delta$.

FIG. 10 shows that there is a position at which line segments identifying correspondences between the amount of defocus z and the irradiation beam radius w in the cases of a large angle of divergence (see a thin line in FIG. 10), a small angle of divergence (see a thick line in FIG. 10), and the specification central value (see a medium thick line in FIG. 10) coincide with each other. Hence, setting the amount of defocus z so as to correspond to the position (see an arrow in FIG. 10) can realize the irradiating optical system 51b that can achieve the desired beam diameter without effects of individual difference in angle of divergence of the semiconductor laser 51a and which achieves a greatest depth of focus.

Specifically, as an example, consideration will be given to a case where the wavelength $\lambda$=808 nm, the desired irradiation beam radius w=8 μm (the beam diameter is 16 μm), and the individual difference in angle of divergence of the semiconductor laser 51a is 0.1. In this case, according to the above-described series of equations, the irradiation $NA_c$ of the condensing lens 65 is 0.0457, and the amount of defocus z is 124.4 μm.

Generally, an NA targeted for a beam radius of 8 μm is 0.0321 when determined from the above-described Equation (2). Hence, when the irradiating optical system 51b is formed such that the irradiation $NA_c$ is 0.0457 and the amount of defocus z is 124.4 μm, the irradiating optical system 51b is larger than an ordinary irradiating optical system, and the beam diameter in an intermediate optical path is also large. Thus, when a high-power semiconductor laser 51a is used, the irradiating optical system 51b is very advantageous against degradation of an element.

FIGS. 11A and 11B are diagrams of assistance in explaining another example of configuration of an irradiating optical system. FIG. 11A shows a fast axis direction. FIG. 11B shows a slow axis direction. Incidentally, in the figures, constituent elements similar to those of the above-described example of configuration are identified by the same reference numerals.

An irradiating optical system 51b shown in FIGS. 11A and 11B is suitable for a case where a high-power type of semiconductor laser is used as a semiconductor laser 51a or a case where light returned to the semiconductor laser 51a side is intense because of a metal base thin film deposited on an irradiated object. More specifically, the irradiating optical system 51b shown in FIGS. 11A and 11B has an isolator formed by a polarization beam splitter 66 and a quarter-wave plate 67 for a measure against light returned to the semiconductor laser 51a side. Generally, the polarization beam splitter 66 cannot be used at high power density because of degradation. Hence, when the power of the semiconductor laser 51a is high, a provision may be made by increasing the focal length of a collimator lens 61 and thus widening the diameter of a luminous flux. However, even in such a case, a reducing optical system 68 is disposed in the rear of the isolator to obtain a low irradiation NA without increasing the total length of the irradiating optical system 51b. It suffices to determine the magnification of the reducing optical system 68 together with the focal length of a condensing lens 65 while setting an amount of defocus z as in the case of the above-described example of configuration.

By forming such an irradiating optical system 51b and increasing the power of the semiconductor laser 51a for an application in which returned light occurs, the throughput of the application can be improved.

As described above, when the laser irradiating optical units 51 each composed of the semiconductor laser 51a and the irradiating optical system 51b are formed, and the TFT 10 is manufactured by performing laser annealing treatment using the laser annealing apparatus incorporating the laser irradiating optical units 51, the irradiating optical system 51b is realized which can provide desired irradiation beam radius w without being affected by individual difference in angle of divergence of the semiconductor laser 51a and which achieves a greatest depth of focus when the laser annealing treatment is performed.

Figure 14:
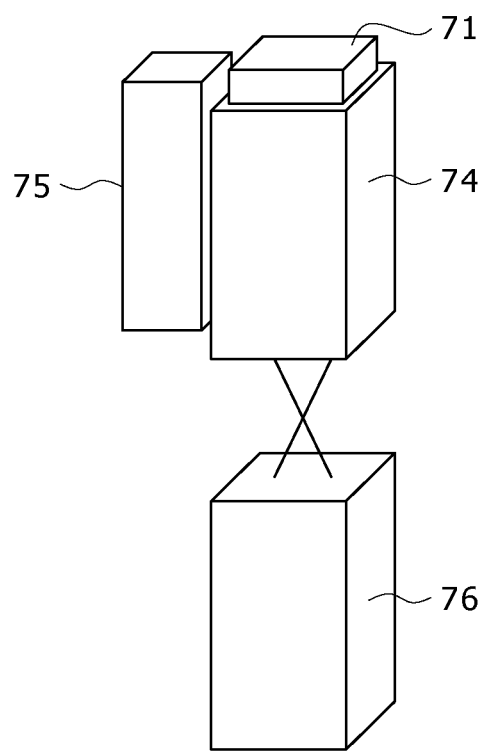
FIG. 14 is a diagram of assistance in explaining an example of configuration of an existing focus adjusting mechanism.

Hence, for example, in a case where one of the semiconductor lasers 51a of the respective laser irradiating optical units 51 needs to be replaced, even when there is an individual difference in angle of divergence between the semiconductor laser 51a before the replacement and a semiconductor laser 51a after the replacement, it is possible to obtain a similar state to that before the replacement by only performing the replacement without selecting the semiconductor laser 51*a*, and avoid causing a difference in conditions for irradiation with laser beam light after the replacement of the semiconductor laser 51*a*. That is, when the semiconductor laser 51*a* is replaced, the setting of conditions such as focus adjustment and the like does not need to be performed. It is therefore possible to expect for example an improvement in processing efficiency attendant on the simplification of a device constitution and the simplification of a processing procedure as a result of obviating a need for a Z-stage 75, a measuring device 76 and the like (see FIG. 14), which have traditionally been necessary.

The same is true for the manufacturing of the laser annealing apparatus. Specifically, not only when the semiconductor laser 51*a* is replaced but also when the laser annealing apparatus is manufactured using a plurality of semiconductor lasers 51*a*, a desired irradiation beam radius w can be obtained without being affected by an individual difference in angle of divergence of each of the semiconductor lasers 51*a*. Thus the setting of conditions such as focus adjustment and the like does not need to be performed. It is therefore possible to expect for example an improvement in processing efficiency attendant on the simplification of a device constitution and the simplification of a processing procedure as a result of obviating a need for a Z-stage 75, a measuring device 76 and the like (see FIG. 14), which have traditionally been necessary. In a case of performing parallel irradiation with a plurality of pieces of laser light, in particular, there should be no difference in effects of laser annealing treatment between the pieces of laser light. Thus eliminating the effects of individual differences in angle of divergence between the semiconductor lasers 51*a* is very effective in uniformizing the effects of laser annealing treatment of the pieces of laser light.

Further, because the depth of focus becomes deepest, a process margin can be expected to be increased.

That is, according to the laser annealing apparatus in the present embodiment and laser annealing treatment using the laser annealing apparatus, the focal position is optimized for a necessary beam diameter, whereby the TFT substrate 20 as an object to be irradiated can be irradiated with laser light without being affected by the individual differences of the semiconductor lasers 51*a* or the like.

It is to be noted that while a preferred concrete embodiment of the present invention has been described in the present embodiment, the present invention is not limited to the contents, and changes can be made as appropriate without departing from the spirit of the present invention.

For example, while in the present embodiment, laser annealing treatment in the process of manufacturing the organic EL display 1 including the TFT 10 is taken as an example, this laser annealing treatment is a mere example, and the present invention can be applied in exactly the same manner to a case of annealing treatment of other semiconductor films.

In addition, while in the present embodiment, a laser annealing apparatus that incorporates a plurality of laser irradiating optical units 51 and performs parallel irradiation with laser light is taken as an example, the present invention is applicable to an apparatus that performs irradiation with a single piece of laser light or performs laser irradiation for a purpose of other than laser annealing treatment as long as the apparatus includes a semiconductor laser and an irradiating optical system and performs laser irradiation. Then, also when the present invention is applied to mass-produce an apparatus including a semiconductor laser and an irradiating optical system, for example, effects of individual difference in angle of divergence of the semiconductor laser are not produced. It can therefore be expected that the yield of the product will be improved greatly as compared with the existing product, and that the product can thus be readily reduced in cost.

It should be understood by those skilled in the art that various modifications, combinations, sub-combinations and alterations may occur depending on design requirements and other factors insofar as they are within the scope of the appended claims or the equivalents thereof.

What is claimed is:

1. An irradiating apparatus for irradiating an irradiation object with a beam of light emitted from a semiconductor laser, comprising:
   the semiconductor laser from which the beam of light is emitted; and
   an irradiating optical system interposed between the irradiation object and the semiconductor laser and which focuses the beam of light on the irradiation object,
   wherein, letting (1) w be a radius of the beam for irradiating said irradiation object,
   (2) Δ be a rate of individual difference in angle of divergence of said semiconductor laser,
   and (3) λ be the wavelength of the beam of light from said semiconductor laser,
   (a) a focal position of the irradiating optical system interposed between the semiconductor laser and the irradiation object is defocused from the irradiation object in a first axis direction such that a distance z between the focal position and the irradiation object is defined by the relationship $$z = \frac{\pi \cdot w^2}{\lambda} \cdot \frac{1 - \Delta^2}{(1 - \Delta^2)^2 + 1},$$

and
   (b) the focal position of the irradiating optical system interposed between the semiconductor laser and the irradiation object is focused on the irradiation object in a second axis direction, the second axis direction being perpendicular to the first axis direction.

2. A semiconductor device manufacturing apparatus for performing annealing treatment in which an irradiation object is irradiated with a beam of light emitted from a semiconductor laser so as to modify a semiconductor film in said irradiation object, the apparatus comprising:
   the semiconductor laser from which the beam of light is emitted;
   an irradiating optical system interposed between the irradiation object and the semiconductor laser and which focuses the beam of light onto the irradiation object,
   wherein, letting (1) w be a radius of a beam for irradiating said irradiation object, (2) Δ be a rate of individual difference in angle of divergence of said semiconductor laser, and λ (3) be beam wavelength of said semiconductor laser,
   (a) a focal position of the irradiating optical system interposed between said semiconductor laser and said irradiation object is defocused from the irradiation object in a first axis direction such that a distance z between said focal position and said irradiation object is defined by the relationship $$z = \frac{\pi \cdot w^2}{\lambda} \cdot \frac{1-\Delta^2}{(1-\Delta^2)^2+1},$$

and
- (b) the focal position of the irradiating optical system interposed between the semiconductor laser and the irradiation object on the irradiation object is focused in a second axis direction, the second axis direction being perpendicular to the first axis direction.

3. The semiconductor device manufacturing apparatus according to claim 2, wherein said semiconductor laser has a broad area type emitter, and a beam diameter is defined in a direction perpendicular to a direction of length of said emitter.

4. The semiconductor device manufacturing apparatus according to claim 2, wherein said irradiating optical system includes:
- a collimator lens for collimating a luminous flux from a broad area type semiconductor laser;
- a uniformizing optical system for uniformizing the luminous flux in a direction of length of an emitter of said semiconductor laser;
- a condenser lens for irradiating said irradiation object with the luminous flux obtained through said uniformizing optical system; and
- a reducing optical system for reducing diameter of the luminous flux in a direction perpendicular to a direction of length of said emitter.

5. The semiconductor device manufacturing apparatus according to claim 2, further comprising:
- a stage for moving said irradiation object in a direction perpendicular to a broad area direction of said semiconductor laser; and
- a plurality of said semiconductor lasers and a plurality of said irradiating optical systems;
- wherein said semiconductor lasers emit beam light in parallel with each other.

6. The irradiating apparatus according to claim 1, wherein defocus by the distance z is achieved along the first axis, the first axis being perpendicular to a length of an emitter of the irradiating apparatus.

7. The irradiating apparatus according to claim 1, wherein focus is achieved on the irradiating object along the second axis, the second axis being parallel to a length of an emitter of the irradiating apparatus.

8. The semiconductor device manufacturing apparatus according to claim 2, wherein defocus by the distance z is achieved along the first axis, the first axis being perpendicular to a length of an emitter of the semiconductor device manufacturing apparatus.

9. The semiconductor device manufacturing apparatus according to claim 2, wherein focus is achieved on the irradiating object along the second axis, the second axis being parallel to a length of an emitter of the semiconductor device manufacturing apparatus.

* * * * *